(12) United States Patent
Liu (10) Patent No.: US 9,172,389 B2
(45) Date of Patent: Oct. 27, 2015

(54) HIGH-SPEED SUCCESSIVE APPROXIMATION ANALOG-TO-DIGITAL CONVERTER

(71) Applicant: MediaTek Inc., Hsin-Chu (TW)

(72) Inventor: Chun-Cheng Liu, Xianxi Township, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/284,177

(22) Filed: May 21, 2014

(65) Prior Publication Data

US 2015/0194980 A1 Jul. 9, 2015

Related U.S. Application Data

(60) Provisional application No. 61/925,307, filed on Jan. 9, 2014.

(51) Int. Cl.
*H03M 1/38* (2006.01)
*H03M 1/40* (2006.01)

(52) U.S. Cl.
CPC .................................. *H03M 1/403* (2013.01)

(58) Field of Classification Search
CPC ......... H03M 1/403; H03M 1/12; H03M 1/00; H03M 2201/13
USPC .................................. 341/161, 172, 155, 156
See application file for complete search history.

(56) References Cited

U.S. PATENT DOCUMENTS

| | | | |
|---|---|---|---|
| 2010/0207791 A1* | 8/2010 | Ohnhaeuser et al. | 341/118 |
| 2012/0218137 A1* | 8/2012 | Yoon et al. | 341/172 |
| 2013/0044015 A1* | 2/2013 | Reinhold et al. | 341/110 |
| 2013/0321189 A1* | 12/2013 | Yoshioka et al. | 341/156 |

OTHER PUBLICATIONS

Chan, K.L., et al.; "A 8.9-ENOB 2.5-W 150-KSs Non-Binary Redundant Successive Approximation ADC in 0.18-um CMOS for Bio-Implanted Devices;" 32nd annual International Conference of the IEEE EMBS; Aug./Sep. 2010; pp. 1-4.
Kurisu, Y., et al.; "A Successive Approximation AD Converter Using Generalized Non-binary Algorithm;" 2013 IEEE 43rd International Symposium on Multiple-Valued Logic; 2013; pp. 1-6.

* cited by examiner

*Primary Examiner* — Jean B Jeanglaude
(74) *Attorney, Agent, or Firm* — McClure, Qualey & Rodack, LLP (57) ABSTRACT

A successive approximation register analog-to-digital converter (SAR ADC) for high-speed applications. The SAR ADC uses at least one set of capacitors. Each set of capacitors is formed by $2^M$ capacitor cells. The set of $2^M$ capacitor cells is allocated into p capacitors $C(p-1)$ to $C0$ decreasing in capacitance. $C(p-1) < C(p-2) + C(p-3) + \ldots + C0$, and $C(p-1)$ includes $(2^{M-1} - 2^q)$ capacitor cells.

18 Claims, 6 Drawing Sheets

HIGH-SPEED SUCCESSIVE APPROXIMATION ANALOG-TO-DIGITAL CONVERTER

CROSS REFERENCE TO RELATED APPLICATIONS

This application claims the benefit of U.S. Provisional Application No. 61/925,307, filed Jan. 9, 2014, the entirety of which is incorporated by reference herein.

BACKGROUND OF THE INVENTION

1. Field of the Invention

The present invention relates to a successive approximation register analog-to-digital converter (SAR ADC).

2. Description of the Related Art

A successive approximation register analog-to-digital converter (SAR ADC) is a type of analog-to-digital converter that converts a continuous analog waveform into a discrete digital representation by a search scheme.

One of the most common implementations of SAR ADC, the charge-redistribution SAR ADC, uses a plurality of capacitors. The capacitors are individually switched in a search scheme for the approximation of an analog input of the SAR ADC. However, because of the long settling time required for the capacitors, the charge-redistribution technology is not a good fit for high-speed applications.

BRIEF SUMMARY OF THE INVENTION

A high-speed successive approximation register analog-to-digital converter (SAR ADC) and the manufacturing method thereof are disclosed.

An SAR ADC in accordance with an exemplary embodiment of the invention comprises an SAR subcircuit, a digital-to-analog converter (DAC), and a comparator. The SAR subcircuit generates digital control bits in different cycles of a search scheme of the SAR ADC. The DAC comprises at least one set of capacitors. The DAC couples an analog input of the SAR ADC to the at least one set of capacitors and operates the at least one set of capacitors in accordance with the digital control bits. Each set of capacitors comprises p capacitors $C_{p-1}$ to $C_0$ decreasing in capacitance, where p capacitors $C_{p-1}$ to $C_0$ are formed by $2^M$ capacitor cells, $C_{p-1} < C_{p-2} + C_{p-3} + \ldots + C_0$, $C_{p-1}$ includes $(2^{M-1}-2^q)$ capacitor cells, and p, q and M are numbers. The comparator is fed with an analog output transmitted from the DAC and generates a comparator output. The comparator output is coupled to the SAR subcircuit for generation of the digital control signals. Digital representation of the analog input of the SAR ADC is approximated in the search scheme.

A analog-to-digital conversion method in accordance with an exemplary embodiment of the invention comprises the following steps: providing at least one set of capacitors in a digital-to-analog converter of a successive approximation register analog-to-digital converter, wherein each set of capacitors is formed by $2^M$ capacitor cells and M is a number; allocating each set of $2^M$ capacitor cells into p capacitors $C_{p-1}$ to $C_0$ decreasing in capacitance, where $C_{p-1} < C_{p-2} + C_{p-3} + \ldots + C_0$, $C_{p-1}$ includes $(2^{M-1}-2^q)$ capacitor cells, and p and q are numbers; and operating the successive approximation register analog-to-digital converter to get digital representation of an analog input of the successive approximation register analog-to-digital converter.

In some exemplary embodiments, the $2^q$ capacitor cells saved from the capacitor $C_{p-1}$ is divided into r groups to be allocated to r different capacitors of the capacitors $C_{p-2}$ to $C_1$, where r is a number. Note that in each of the r groups, the number of capacitor cells is a power of 2.

In some exemplary embodiments, $C_{p-j}$, one of the capacitors $C_{p-2}$ to $C_{p-M}$ has either $2^{M-j}$ or $(2^{M-j}+2^k)$ capacitor cells, where k is not greater than q, and $2^{M-j} \neq 2^k$. $C_0$ may have just one capacitor cell. In an exemplary embodiment, the number of capacitor cells in any of the capacitors $C_{p-M-1}$ to $C_1$ is a power of 2.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
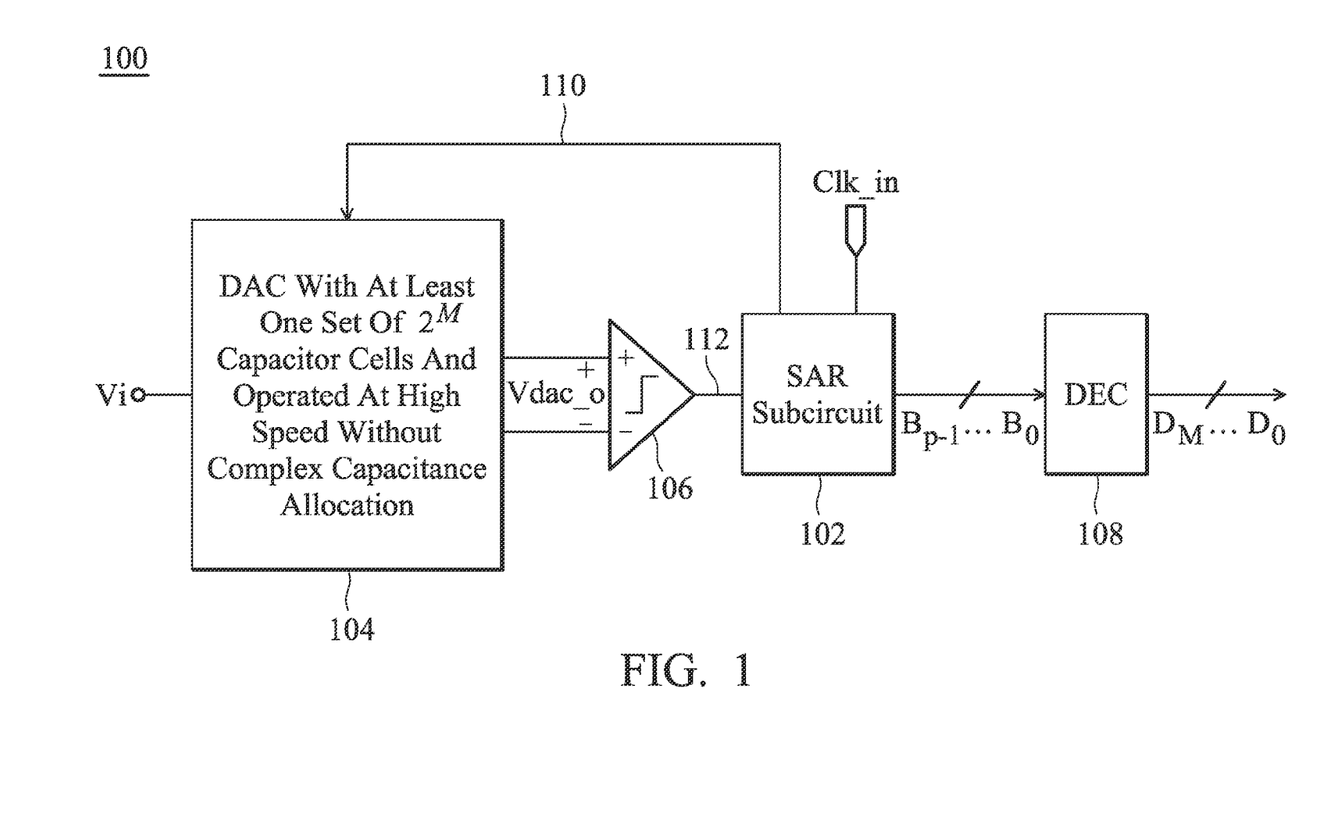
FIG. 1 depicts a successive approximation register analog-to-digital converter (SAR ADC) 100 in accordance with an exemplary embodiment of the invention.

FIG. 1 depicts a successive approximation register analog-to-digital converter (SAR ADC) 100 in accordance with an exemplary embodiment of the invention. An analog-to-digital conversion method with respect to the SAR ADC 100 is also discussed.

The SAR ADC 100 comprises an SAR subcircuit 102, a digital-to-analog converter (DAC) 104, a comparator 106 and a decoder 108. In comparison with the conventional charge-redistribution technique, the DAC 104 is especially designed for high-speed applications and no complex capacitance allocation is required.

The SAR subcircuit 102 generates digital control bits 110 in different cycles (e.g., controlled by the clock clk_in) of a search scheme of the SAR ADC 100. The DAC 104 comprises at least one set of capacitors. The DAC 104 couples an analog input Vi of the SAR ADC 100 to the at least one set of capacitors and operates the at least one set of capacitors in accordance with the digital control bits 110. Note that each set of capacitors comprises p capacitors $C_{p-1}$ to $C_0$ decreasing in capacitance. The p capacitors $C_{p-1}$ to $C_0$ are formed by $2^M$ capacitor cells, where $C_{p-1} < C_{p-2} + C_{p-3} + \ldots + C_0$, and $C_{p-1}$ includes $(2^{M-1}-2^q)$ capacitor cells, and p, q and M are numbers.

The comparator 106 is fed with an analog output Vdac_o transmitted from the DAC 104. The comparator 106 generates a comparator output 112 to be coupled to the SAR subcircuit 102 for generation of the digital control signals 110. The SAR subcircuit 102 further generates p digital bits $B_{p-1}$ to $B_0$ (from MSB to LSB) in accordance with the comparator output 112. The decoder 108 decodes the p digital bits $B_{p-1}$ to $B_0$ generated from the SAR subcircuit 102 into a digital representation $D_M$ to $D_0$ having (M+1) bits. Digital representation $D_M \ldots D_0$ of the analog input Vi of the SAR ADC 100 is approximated in the search scheme (dependent on the comparator output 112.)

Figure 2:
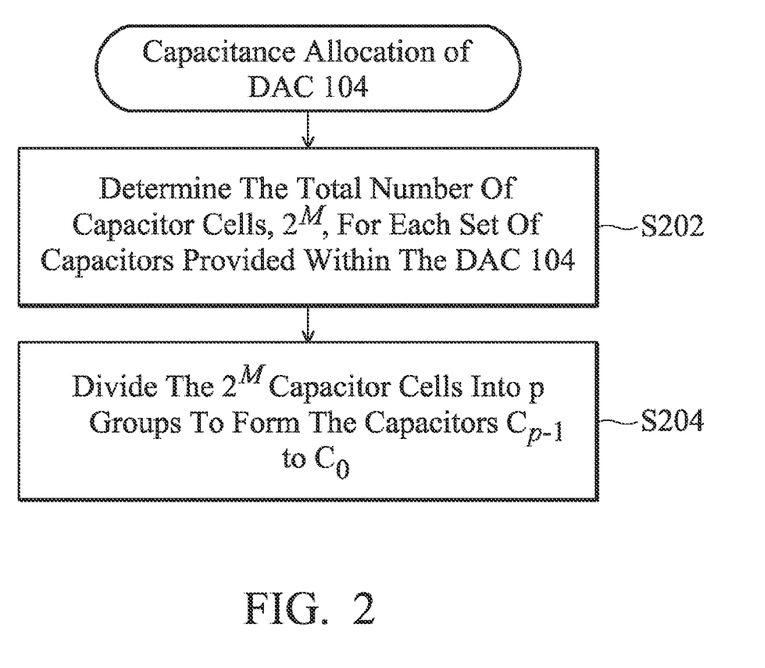
FIG. 2 is a flowchart depicting the capacitance allocation for the DAC 104 in accordance with an exemplary embodiment of the invention.

FIG. 2 is a flowchart depicting the capacitance allocation for the DAC 104 in accordance with an exemplary embodiment of the invention. In step S202, the total number of capacitor cells, $2^M$, for each set of capacitors provided within the DAC 104 is determined. The set of $2^M$ capacitor cells may be fabricated in an array. In step S204, the $2^M$ capacitor cells are divided into p groups to form the capacitors $C_{p-1}$ to $C_0$. In addition to making $C_{p-1} < C_{p-2} + C_{p-3} + \ldots + C_0$ and $C_{p-1}$ including $(2^{M-1} - 2^q)$ capacitor cells, the $2^q$ capacitor cells saved from the capacitor $C_{p-1}$ may be divided into r groups to be allocated to r different capacitors of the capacitors $C_{p-2}$ to $C_1$, where r is a number and, in each of the r groups, the number of capacitor cells is a power of 2. In another exemplary embodiment, $C_{p-j}$, one of the capacitors $C_{p-2}$ to $C_{p-M}$ has either $2^{M-j}$ or $(2^{M-j} + 2^k)$ capacitor cells, where k is not greater than q and $2^{M-j} \neq 2^k$. $C_0$ may have just one capacitor cell. In an exemplary embodiment, the number of capacitor cells in any of the capacitors $C_{p-M-1}$ to $C_1$ is a power of 2.

Figure 3A:
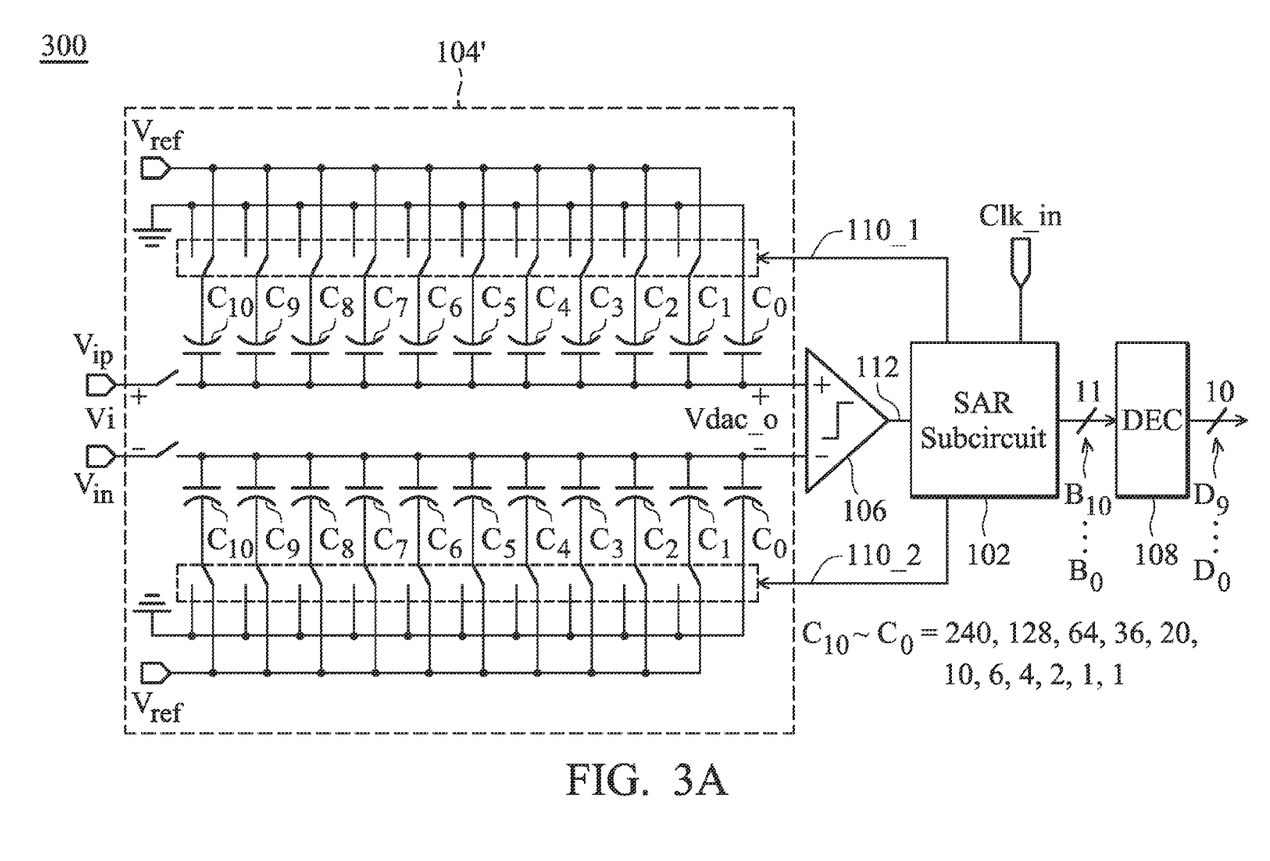
FIG. 3A depicts an SAR ADC in accordance with an exemplary embodiment of the invention.
Figure 4A:
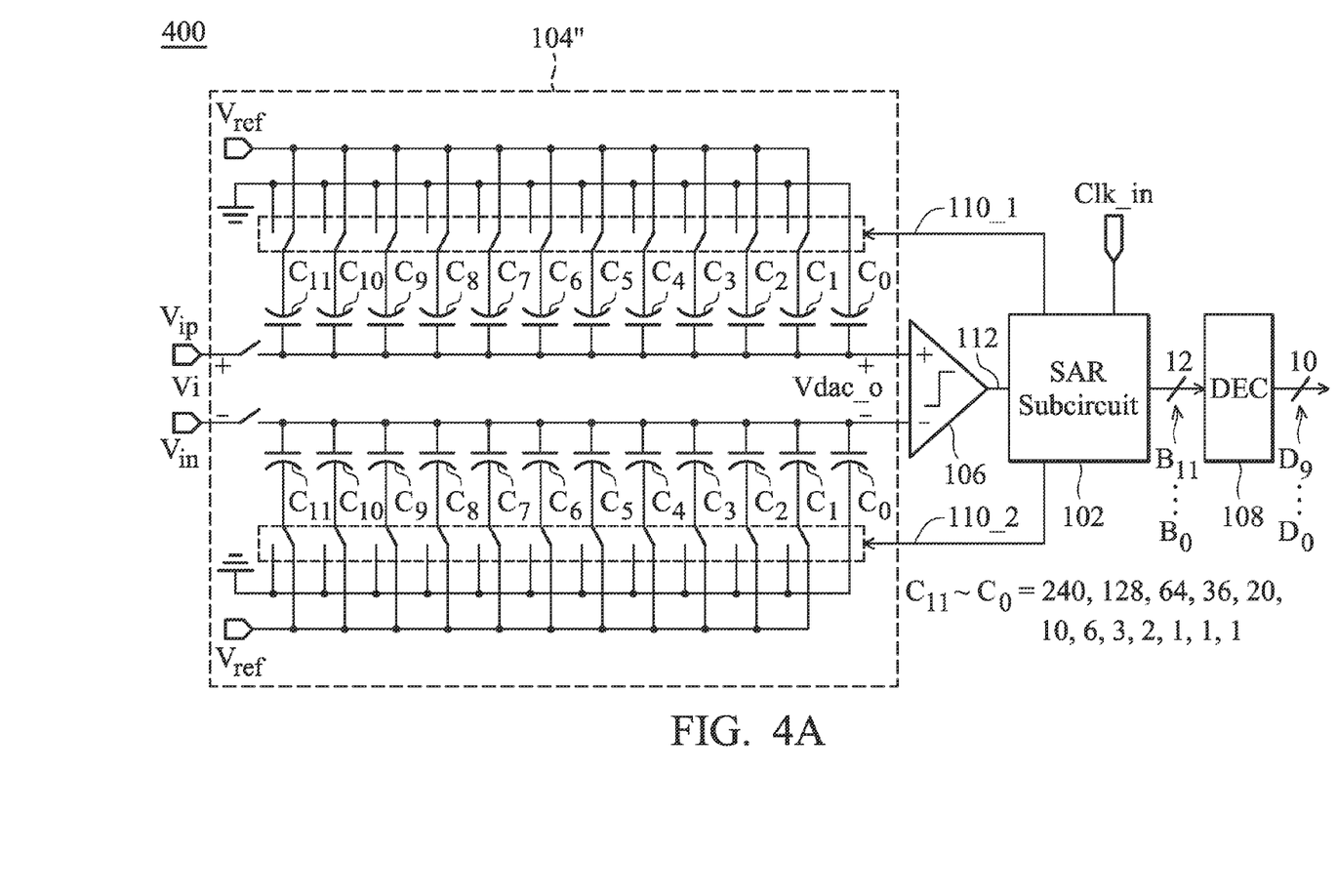
FIG. 4A depicts an SAR ADC in accordance with an exemplary embodiment of the invention.

FIGS. 3A and 4A show SAR ADCs 300 and 400 in accordance with exemplary embodiments of the invention. As shown, the DACs 104' and 104" are in a differential architecture, using differential input terminals Vip and Vin to receive the positive and negative differential voltages of the analog input Vi, and comprising a first set of capacitors whose top plates are connected to a positive input terminal '+' of the comparator 106 and a second set of capacitors whose top plates are connected to a negative input terminal '−' of the comparator 106. The comparator 106 receives an analog output Vdac_o in a differential form. The SAR subcircuit 102 provides the first set of capacitors in the non-inverting path with digital control bits 110_1. The SAR subcircuit 102 provides the second set of capacitors in the inverting path with digital control bits 110_2. During a sample phase prior to the search scheme, the analog input Vi is sampled between the top plates of the first set of capacitors (in the non-inverting path) and the top plates of the second set of capacitors (in the inverting path).

In FIG. 3A, p is 11. In FIG. 4A, p is 12. The capacitors $C_{p-1}$ to $C_0$ of the first and second sets of capacitors correspond to p different cycles of the search scheme. A first set of switches are provided with the first set of capacitors (in the non-inverting path) and operated in accordance with the digital control bits 110_1. A second set of switches are provided with the second set of capacitors (in the inverting path) and operated in accordance with the digital control bits 1102. Note that the capacitors ($C_0$ in both paths) corresponding to the last cycle of the p different cycles of the search scheme is not switch-controlled. The capacitor $C_0$ of the first set of capacitors (in the non-inverting path) is coupled between the positive input terminal '+' of the comparator 106 and a ground terminal. The capacitor $C_0$ of the second set of capacitors (in the inverting path) is coupled between the negative input terminal '−' of the comparator 106 and the ground terminal. Except for the last cycle, when the comparator output 112 is high, the switch for the capacitor corresponding to the current cycle in the first set of capacitors (in the non-inverting path) is switched to pull down the voltage level at the top plates of the first set of capacitors. Except for the last cycle, when the comparator output 112 is low, the switch for the capacitor corresponding to the current cycle in the second set of capacitors (in the inverting path) is switched to pull down the voltage level at the top plates of the second set of capacitors. Based on the comparator output 112 during the p different cycles of the search scheme, the SAR subcircuit 102 generates the digital bits $B_{p-1}$ to $B_0$ to be decoded by the decoder 108 for the digital representation $D_9 \ldots D_0$.

In FIG. 3A, p=11, $C_{10} \sim C_0$=240, 128, 64, 36, 20, 10, 6, 4, 2, 1, 1 capacitor cell(s). The size of the capacitors $C_{10} \sim C_0$ may be estimated by the following calculation:

| $C_{10}$ | $C_9$ | $C_8$ | $C_7$ | $C_6$ | $C_5$ | $C_4$ | $C_3$ | $C_2$ | $C_1$ | $C_0$ |
|---|---|---|---|---|---|---|---|---|---|---|
| $2^8$ | $2^7$ | $2^6$ | $2^5$ | $2^4$ | $2^3$ | $2^2$ | $2^1$ | $2^0$ | | 1 |
| − | | | + | + | + | + | + | + | | |
| $2^4$ | → | | $2^2$ | $2^2$ | $2^1$ | $2^1$ | $2^1$ | $2^0$ | $2^0$ | |
| 240 | 128 | 64 | 36 | 20 | 10 | 6 | 4 | 2 | 1 | 1 |

Because $C_{10} < C_9 + C_8 + \ldots + C_0$, the approximation error that occurred in the first cycle (corresponding to $C_{10}$) of the search scheme can be compensated for in later cycles. Thus, the operation speed of the SAR ADC is no longer limited by the settling time of large-sized capacitors. Furthermore, the capacitance allocation based on a binary concept (a power of 2) is not a complex design.

Figure 3B:
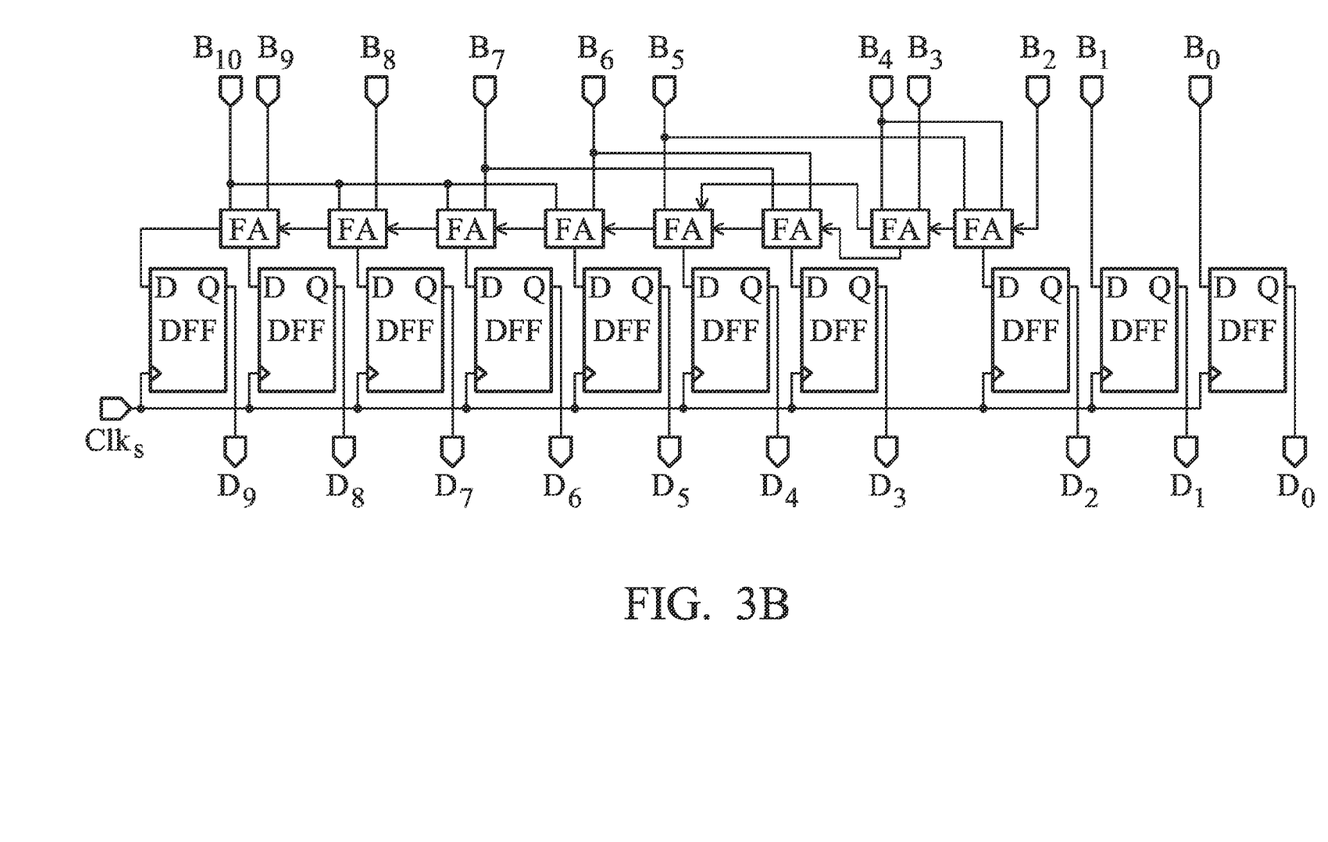
FIG. 3B depicts the decoder (DEC) 108 of the SAR ADC of FIG. 3A.

FIG. 3B depicts the decoder 108 of the SAR ADC 300 of FIG. 3A. Only 8 full adders and 10 D-flip-flops are required. Much simpler than those for the conventional charge-redistribution design.

In FIG. 4A, p=12, $C_{11} \sim C_0$=240, 128, 64, 36, 20, 10, 6, 3, 2, 1, 1, 1 capacitor cell(s). The size of the capacitors $C_{11} \sim C_0$ may be estimated by the following calculation:

| $C_{11}$ | $C_{10}$ | $C_9$ | $C_8$ | $C_7$ | $C_6$ | $C_5$ | $C_4$ | $C_3$ | $C_2$ | $C_1$ | $C_0$ |
|---|---|---|---|---|---|---|---|---|---|---|---|
| $2^8$ | $2^7$ | $2^6$ | $2^5$ | $2^4$ | $2^3$ | $2^2$ | $2^1$ | $2^0$ | | | 1 |
| − | | | + | + | + | + | + | + | | | |
| $2^4$ | → | | $2^2$ | $2^2$ | $2^1$ | $2^1$ | $2^0$ | $2^0$ | $2^0$ | $2^0$ | |
| 240 | 128 | 64 | 36 | 20 | 10 | 6 | 3 | 2 | 1 | 1 | 1 |

The $2^4$ capacitor cells saved from capacitor $C_{11}$ are divided into 8 groups (more than the 7 groups designed for the SAR ADC 300 of FIG. 3A). In this example, down to the small capacitors $C_3 \sim C_0$ the error compensation capability is still considerable.

Figure 4B:
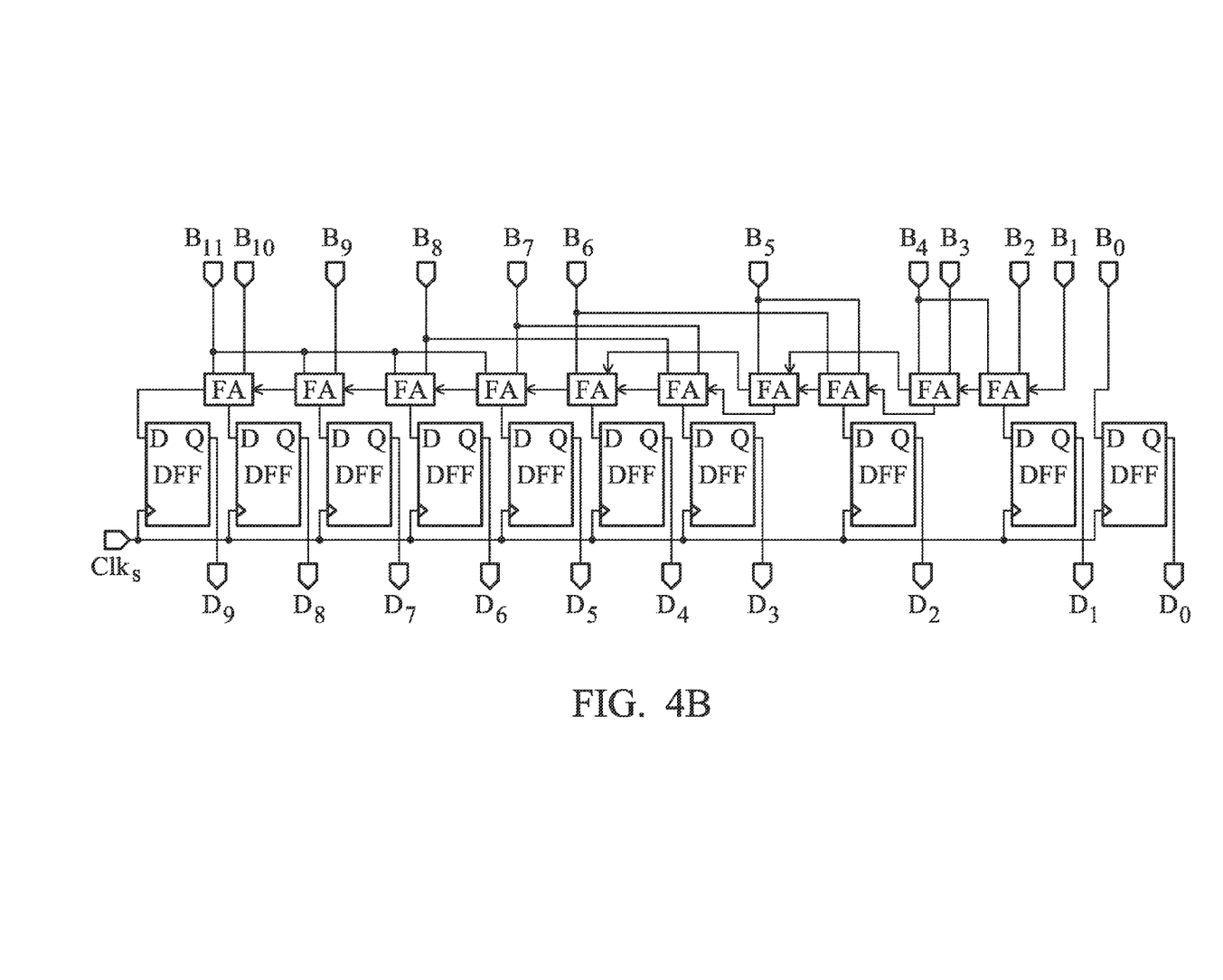
FIG. 4B depicts the decoder (DEC) 108 of the SAR ADC of FIG. 4A.

FIG. 4B depicts the decoder 108 of the SAR ADC 400 of FIG. 4A. Only 10 full adders and 10 D-flip-flops are required. Much simpler than those for the conventional charge-redistribution design.

Note that it is not intended to limit the DAC 104 to the differential architecture or to the top-plate input S/H. Any SAR ADC with the idea of charge redistribution may require the capacitance allocation technology of the disclosure.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive approximation register analog-to-digital converter, comprising:
    a successive approximation register subcircuit, generating digital control bits in different cycles of a search scheme of the successive approximation register analog-to-digital converter;
    a digital-to-analog converter, comprising at least one set of capacitors and coupling an analog input of the successive approximation register analog-to-digital converter to the at least one set of capacitors and operating the at least one set of capacitors in accordance with the digital control bits, wherein each set of capacitors comprises p capacitors $C_{p-1}$ to $C_0$ decreasing in capacitance, the p capacitors $C_{p-1}$ to $C_0$ are formed by $2^M$ capacitor cells, $C_{p-1} < C_{p-2} + C_{p-3} + \ldots + C_0$, $C_{p-1}$ includes $(2^{M-1} - 2^q)$ capacitor cells, and p, q and M are numbers; and
    a comparator, fed with an analog output transmitted from the digital-to-analog converter and generating a comparator output to be coupled to the successive approximation register subcircuit for generation of the digital control signals,
    wherein digital representation of the analog input of the successive approximation register analog-to-digital converter is approximated in the search scheme.

2. The successive approximation register analog-to-digital converter as claimed in claim 1, wherein:
    the $2^q$ capacitor cells saved from the capacitor Cp−1 is divided into r groups to be allocated to r different capacitors of the capacitors Cp−2 to C1, where r is a number; and
    in each group of the r groups, the number of capacitor cells is a power of 2.

3. The successive approximation register analog-to-digital converter as claimed in claim 2, wherein:
    $C_{p-j}$, one of the capacitors $C_{p-2}$ to $C_{p-M}$ has either $2^{M-j}$ or $(2^{M-j} + 2^k)$ capacitor cells, where k is not greater than q, and $2^{M-j} \neq 2^k$.

4. The successive approximation register analog-to-digital converter as claimed in claim 3, wherein:
    capacitor $C_0$ has just one capacitor cell; and
    the number of capacitor cells in any of the capacitors $C_{p-m-1}$ to $C_1$ is a power of 2.

5. The successive approximation register analog-to-digital converter as claimed in claim 1, wherein:
    the successive approximation register subcircuit further generates p digital bits in accordance with the comparator output, to be decoded to the digital representation having (M+1) bits.

6. The successive approximation register analog-to-digital converter as claimed in claim 5, further comprising:
    a decoder, decoding the p digital bits generated by the successive approximation register subcircuit into the digital representation having (M+1) bits.

7. The successive approximation register analog-to-digital converter as claimed in claim 1, wherein:
    the analog input of the successive approximation register analog-to-digital converter is a differential signal represented by a positive differential voltage and a negative differential voltage;
    during a sample phase prior to the search scheme, the positive differential voltage is coupled to top plates of a first set of capacitors of the digital-to-analog converter and the negative differential voltage is coupled to top plates of a second set of capacitors of the digital-to-analog converter;
    the top plates of the first set of capacitors are connected to a positive input terminal of the comparator; and
    the top plates of the second set of capacitors are connected to a negative input terminal of the comparator.

8. The successive approximation register analog-to-digital converter as claimed in claim 7, wherein:
    the capacitors $C_{p-1}$ to $C_0$ of the first and second sets of capacitors correspond to p different cycles of the search scheme;
    the capacitor $C_0$ of the first set of capacitors is coupled between the positive input terminal of the comparator and a ground terminal;
    the capacitor $C_0$ of the second set of capacitors is coupled between the negative input terminal of the comparator and the ground terminal; and
    except for the last cycle, when the comparator output is high, the capacitor corresponding to the current cycle in the first set of capacitors is switched to pull down the voltage level at the top plates of the first set of capacitors.

9. The successive approximation register analog-to-digital converter as claimed in claim 8, wherein:
    except for the last cycle, when the comparator output is low, the capacitor corresponding to the current cycle in the second set of capacitors is switched to pull down the voltage level at the top plates of the second set of capacitors.

10. An analog-to-digital conversion method, comprising:
    providing at least one set of capacitors in a digital-to-analog converter of a successive approximation register analog-to-digital converter, wherein each set of capacitors is formed by $2^M$ capacitor cells and M is a number;
    allocating each set of $2^M$ capacitor cells into p capacitors $C_{p-1}$ to $C_0$ decreasing in capacitance, where $C_{p-1} < C_{p-2} + C_{p-3} + \ldots + C_0$, $C_{p-1}$ includes $(2^{M-1} - 2^q)$ capacitor cells, and p and q are numbers; and
    operating the successive approximation register analog-to-digital converter to get digital representation of an analog input of the successive approximation register analog-to-digital converter.

11. The analog-to-digital conversion method as claimed in claim 10, wherein:
    the $2^q$ capacitor cells saved from the capacitor $C_{p-1}$ is divided into r groups to be allocated to r different capacitors of the capacitors $C_{p-2}$ to $C_1$, where r is a number; and
    in each group of the r groups, the number of capacitor cells is a power of 2.

12. The analog-to-digital conversion method as claimed in claim 11, wherein:
    $C_{p-j}$, one of the capacitors $C_{p-2}$ to $C_{p-M}$ has either $2^{M-j}$ or $(2^{M-j} + 2^k)$ capacitor cells, where k is not greater than q, and $2^{M-j} \neq 2^k$.

13. The analog-to-digital conversion method as claimed in claim 12, wherein:
    capacitor $C_0$ has just one capacitor cell; and
    the number of capacitor cells in any of the capacitors $C_{p-M-1}$ to $C_1$ is a power of 2.

14. The analog-to-digital conversion method as claimed in claim 10, further comprising:
    providing a successive approximation register subcircuit in the successive approximation register analog-to-digital converter, wherein the successive approximation register subcircuit is operative to generate digital control bits in different cycles of a search scheme of the successive approximation register analog-to-digital converter;
    operating the digital-to-analog converter of the successive approximation register analog-to-digital converter to couple an analog input of the successive approximation register analog-to-digital converter to the at least one set of capacitors and operate the at least one set of capacitors in accordance with the digital control bits; and providing a comparator in the successive approximation register analog-to-digital converter, wherein the comparator is fed with an analog output transmitted from the digital-to-analog converter and is operative to generate a comparator output to be coupled to the successive approximation register subcircuit for generation of the digital control signals, wherein the digital representation of the analog input of the successive approximation register analog-to-digital converter is approximated in the search scheme.

15. The analog-to-digital conversion method as claimed in claim 14, wherein:

the successive approximation register subcircuit is further operative to generate p digital bits in accordance with the comparator output, to be decoded to the digital representation having (M+1) bits.

16. The analog-to-digital conversion method as claimed in claim 15, further comprising:

providing a decoder in the successive approximation register analog-to-digital converter, wherein the decoder is operative to decode the p digital bits generated by the successive approximation register subcircuit into the digital representation having (M+1) bits.

17. The analog-to-digital conversion method as claimed in claim 10, further comprising:

providing a first set of switches for a first set of capacitors of the digital-to-analog converter; and providing a second set of switches for a second set of capacitors of the digital-to-analog converter, wherein:

the first and second sets of switches are controlled by the digital control bits;

the analog input of the successive approximation register analog-to-digital converter is a differential signal represented by a positive differential voltage and a negative differential voltage;

during a sample phase prior to the search scheme, the positive differential voltage is coupled to top plates of the first set of capacitors and the negative differential voltage is coupled to top plates of the second set of capacitors;

the top plates of the first set of capacitors are connected to a positive input terminal of the comparator;

the top plates of the second set of capacitors are connected to a negative input terminal of the comparator;

the capacitors $C_{p-1}$ to $C_0$ of the first and second sets of capacitors correspond to p different cycles of the search scheme;

the capacitor $C_0$ of the first set of capacitors is coupled between the positive input terminal of the comparator and a ground terminal;

the capacitor $C_0$ of the second set of capacitors is coupled between the negative input terminal of the comparator and the ground terminal; and except to the last cycle, when the comparator output is high, the switch for the capacitor corresponding to the current cycle in the first set of capacitors is switched to pull down the voltage level at the top plates of the first set of capacitors.

18. The analog-to-digital conversion method as claimed in claim 17, wherein:

except to the last cycle, when the comparator output is low, the switch for the capacitor corresponding to the current cycle in the second set of capacitors is switched to pull down the voltage level at the top plates of the second set of capacitors.

* * * * *